(12) United States Patent
Kim et al.

(10) Patent No.: US 7,733,573 B2
(45) Date of Patent: Jun. 8, 2010

(54) LENS, MANUFACTURING METHOD THEREOF AND LIGHT EMITTING DEVICE PACKAGE USING THE SAME

(75) Inventors: Yong Suk Kim, Seoul (KR); Hoon Hurh, Seoul (KR); Geun Ho Kim, Seoul (KR); Yu Ho Won, Seoul (KR)

(73) Assignee: LG Electronics Inc., Seoul (KR)

( * ) Notice: Subject to any disclaimer, the term of this patent is extended or adjusted under 35 U.S.C. 154(b) by 41 days.

(21) Appl. No.: 11/902,779

(22) Filed: Sep. 25, 2007

(65) Prior Publication Data

US 2008/0088953 A1    Apr. 17, 2008

(30) Foreign Application Priority Data

Sep. 28, 2006  (KR) .................. 10-2006-0094629

(51) Int. Cl.
G02B 3/00 (2006.01)
G02B 7/00 (2006.01)
G02B 9/00 (2006.01)
G02B 11/00 (2006.01)
G02B 13/00 (2006.01)
G02B 15/00 (2006.01)
G02B 17/00 (2006.01)
G02B 25/00 (2006.01)

(52) U.S. Cl. .................................... 359/642
(58) Field of Classification Search ................ 359/811, 359/642; 257/79, 80, 98–100
See application file for complete search history.

(56) References Cited

U.S. PATENT DOCUMENTS

| 6,614,602 | B1 | 9/2003 | Huang |
| 6,830,711 | B2* | 12/2004 | Mills et al. .................. 264/1.32 |
| 7,290,875 | B2* | 11/2007 | Blum et al. .................. 351/159 |
| 2002/0084462 | A1* | 7/2002 | Tamai et al. .................. 257/79 |
| 2005/0045903 | A1 | 3/2005 | Abe et al. |
| 2005/0184387 | A1* | 8/2005 | Collins et al. ............... 257/712 |
| 2005/0242708 | A1 | 11/2005 | Keong et al. |

FOREIGN PATENT DOCUMENTS

| JP | 56-019685 A | 2/1981 |
| JP | 56-152274 A | 11/1981 |
| JP | 58186980 | 11/1983 |
| JP | 07221349 | 8/1995 |
| JP | 10-242526 | 9/1998 |
| JP | 2000-252524 | 9/2000 |
| JP | 2002-270888 A | 9/2002 |
| JP | 2003-163382 A | 6/2003 |
| JP | 2003-258352 A | 9/2003 |
| JP | 2004-271702 A | 9/2004 |
| KR | 10-2004-0027369 A | 4/2004 |

* cited by examiner

*Primary Examiner*—Scott J Sugarman
*Assistant Examiner*—Vipin M Patel
(74) *Attorney, Agent, or Firm*—Ked & Associates, LLP

(57) ABSTRACT

A lens and a light emitting device package formed by introducing surface mount technology (SMT) are disclosed. The lens includes a refractive portion which refracts incident light, and at least one surface mount portion, wherein a portion of the surface mount portion is formed in the refractive portion.

4 Claims, 6 Drawing Sheets

LENS, MANUFACTURING METHOD THEREOF AND LIGHT EMITTING DEVICE PACKAGE USING THE SAME

CROSS-REFERENCE TO RELATED APPLICATION

This application claims the benefit of Korean Patent Application No. 10-2006-0094629, filed on Sep. 28, 2006, which is hereby incorporated by reference in its entirety as if fully set forth herein.

BACKGROUND OF THE INVENTION

1. Field of the Invention

The present invention relates to a lens and a manufacturing method thereof, and more particularly to a lens and a light emitting device package formed by introducing surface mount technology (SMT).

2. Discussion of the Related Art

Along with the development of fields using light, parts using optical materials have been widely used in an optical communication device, an optical storage device, medical optical equipment and the like in various industrial fields. The parts using optical materials include a commonly-used lens, a prism, a beam splitter, a reflection mirror and a diffraction grating.

In the parts using optical materials, the lens is classified into a spherical lens, an aspherical lens, a ball lens, a GRIN lens and the like. Also, the lens is classified into an epoxy lens, a glass lens, a silicone lens and the like according to a material of the lens. Recently, a technology is being developed for a small-sized lens, a lightweight lens, a high-performance lens, and a lens having a large aperture. Particularly, along with the development of a light emitting diode (LED) industry, the demand and requirement for camera flash lenses of portable phones and lenses of LCD products using LED backlight sources are increasing.

Although the glass lens has high chemical and heat resistance, molding of the glass lens is complicated and expensive compared to molding of polymeric materials. Thus, a method of manufacturing glass by molding polymeric materials has been widely used.

Further, an injection molding method using a mold is widely used as a method of manufacturing a lens. In the injection molding method, a viscous fluid such as silicone gel or epoxy is injected into the mold and then molded, and the mold is separated, thereby manufacturing a lens. The lens manufactured by the above-mentioned method is installed at a specified position of a device having a light emitting device such as a light emitting diode or a laser diode. The lens refracts light emitted from the light emitting device to change a light path.

In a conventional method, cream solder having high electric and heat conductivity are formed at portions of light emitting devices of PCB by patterning cream solder only at desired positions using a mask. Electronic devices such as light emitting diodes and Zener diodes are arranged and positioned on the cream solder pattern. The cream solder is heated to a temperature higher than a melting point and cooled down and, thus, electric and optical devices and the metal pattern of PCB are electrically and mechanically connected. That is, after the electric and optical devices are connected, epoxy with high adhesivity is bonded to a portion for mounting a lens, and the lens is mounted on the portion with epoxy by a transfer device. Then, when heating to an appropriate temperature and cooling, the lens is bonded to PCB through epoxy.

However, the bonding process should use epoxy capable of bonding at a temperature less than the melting point of the cream solder. Accordingly, there is a limit in selecting the epoxy and cream solder. Since the electric and optical devices are connected and the lens is bonded, the processing time increases. Also, since the light emitting devices are connected to PCB and the lens is bonded after increasing the temperature, the PCB may become twisted. Thus, it is impossible to accurately arrange the light emitting devices and lens and the unit cost increases.

SUMMARY OF THE INVENTION

Accordingly, the present invention is directed to a lens, a manufacturing method thereof and a light emitting device package using the same that substantially obviate one or more problems due to limitations and disadvantages of the related art.

An object of the present invention is to provide a method of accurately arranging a light emitting device and a lens on a substrate.

Another object of the present invention is to provide a method of arranging a light emitting device and a lens on a substrate by a simple process and with the inexpensive cost.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a lens includes a refractive portion which refracts incident light; and at least one surface mount portion, wherein a portion of the surface mount portion is formed in the refractive portion.

In accordance with another aspect of the present invention, there is provided a method of manufacturing a lens comprising preparing at least one surface mount portion; and forming a lens in a region including a portion of the surface mount portion.

In accordance with yet another aspect of the present invention, there is provided a light emitting device package comprising a substrate with a light emitting device; a lens which refracts light emitted from the light emitting device and transmits the light; and at least one surface mount portion which fixes the lens on the substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1A:
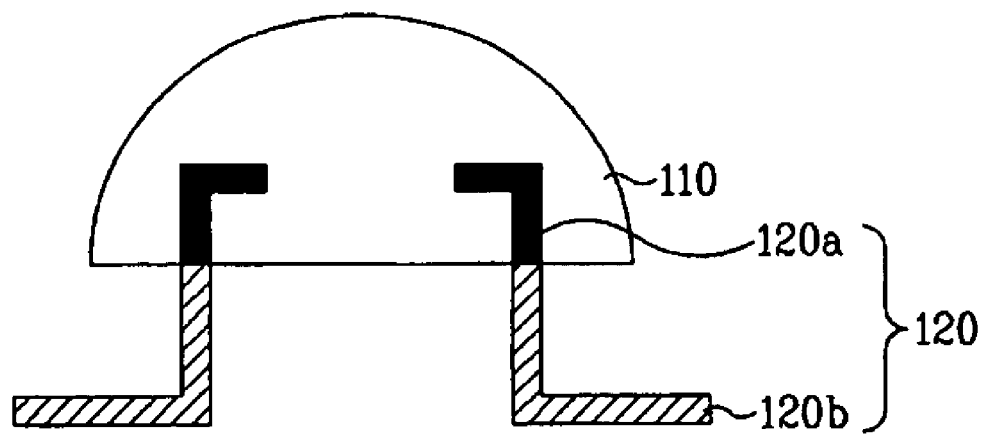
FIGS. 1A to 1E show cross-sectional views of a lens according to an embodiment of the present invention.
Figure 1B:
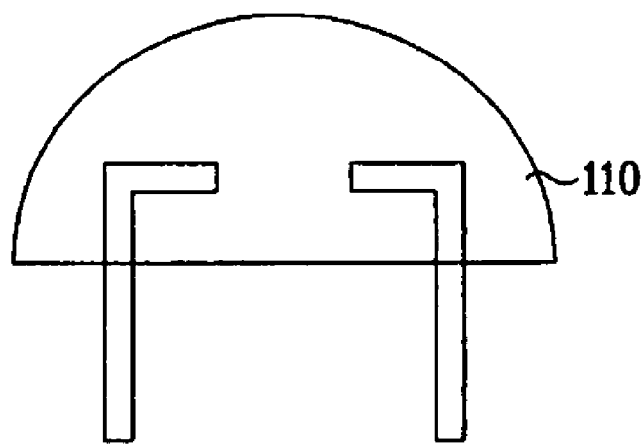
Figure 1C:
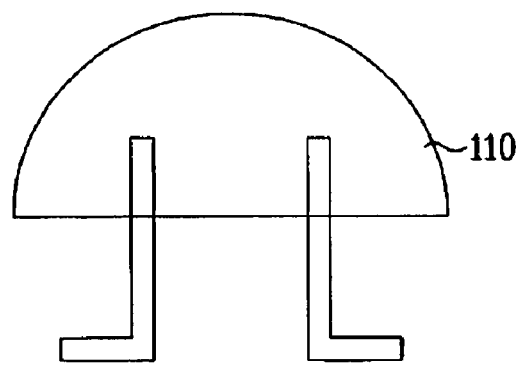
Figure 1D:
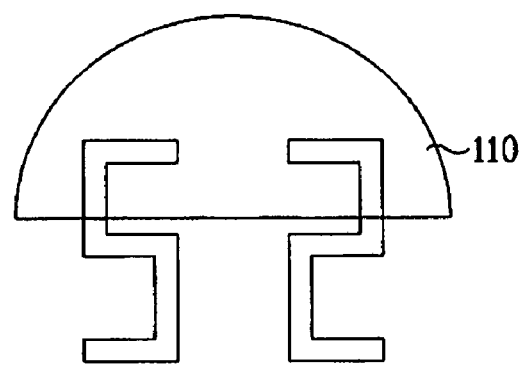
Figure 1E:
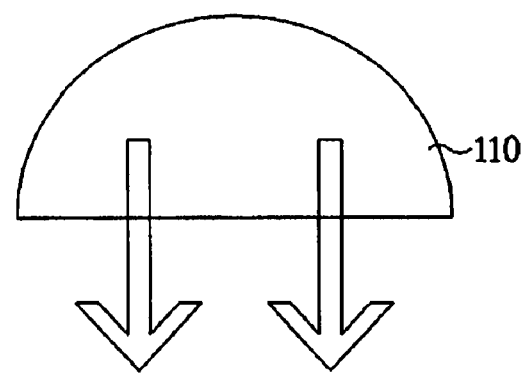

Reference will now be made in detail to the preferred embodiments of the present invention, examples of which are illustrated in the accompanying drawings. Wherever possible, the same reference numbers will be used throughout the drawings to refer to the same or like parts.

Hereinafter, an embodiment of the present invention will be described in detail with reference to the accompanying drawings.

A dimension of a thickness is enlarged in the accompanying drawings to clearly represent several layers and regions. A thickness ratio of respective layers shown in the drawings is not necessarily a real thickness ratio. Meanwhile, when a portion such as a layer, a film, a region and a plate is formed or disposed "on" the other portion, it should be understood that the portion may be formed directly on the other portion through a direct contact, or another portion may be disposed therebetween.

A lens according to the present invention has metal leads formed at the lower end of the lens to use surface mount technology (SMT). Accordingly, the lens can be quickly and easily fixed on a substrate having a light emitting device formed thereon through the metal leads.

FIGS. 1A to 1E show cross-sectional views of the lens according to the embodiment of the present invention. The lens according to the embodiment of the present invention will be described with reference to FIGS. 1A to 1E.

The lens according to the embodiment of the present invention includes a refractive portion 110 and surface mount portions 120. A portion of the surface mount portions 120 is formed inside the refractive portion 110. Preferably, the refractive portion 110 is formed of the same material in the same shape as a general lens. The refractive portion 110 refracts incident light to change a light path and transmit the light. The refractive portion 110 may be formed of thermosetting resin such as silicon, epoxy, PC and PMMA or thermoplastic resin. Further, the refractive portion 110 may be formed of resin for a processing of fixing the surface mount portions 120 as will be described below. Further, although the refractive portion 110 is represented in a hemispherical shape, the refractive portion 110 may be formed in a different shape capable of refracting a path of the incident light. Specifically, the refractive portion 110 may be formed in a spherical or non-spherical shape, or in a shape having sectional curvature or bisectional curvature, preferably, having at least one curvature.

Each of the surface mount portions 120 includes a first part 120b and a second part 120a. The second part 120a is fixed into the refractive portion 110 and the first part 120b is fixed on the substrate and the like to fix the refractive portion 110. Further, although two surface mount portions 120 are provided in FIG. 1, at least one surface mount portion may be disposed. As the number of the surface mount portions increases, the lens can be firmly fixed on the substrate, but the cost may increase.

The surface mount portion 120 is a device for mounting a part on the substrate as one example of a surface mount device (SMD). In this embodiment, the surface mount portion 120 includes the first part 120b and the second part 120a. The second part 120a is fixed into the refractive portion 110 and may be fixed into the refractive portion 110 through a resin hardening process or the like, as will be described below. Further, the first part 120b is exposed to the outside of the refractive portion 110 and may be fixed on the substrate through a light emitting device manufacturing process.

The surface mount portion 120 may be formed of one metal selected from a group consisting of Au, Ag, Cu and Al. Further, although the surface mount portion 120 is represented in a 'ㄴ' shape, the surface mount portion 120 may have any shape capable of fixing the part on the substrate, for example, 'ㄱ', 'ㄴ', 'ㄹ' and '↓' as shown in FIGS. 1B to 1E.

The lens according to the embodiment of the present invention can be fixed on the substrate with the surface mount portions through a simple process.

Figure 2:
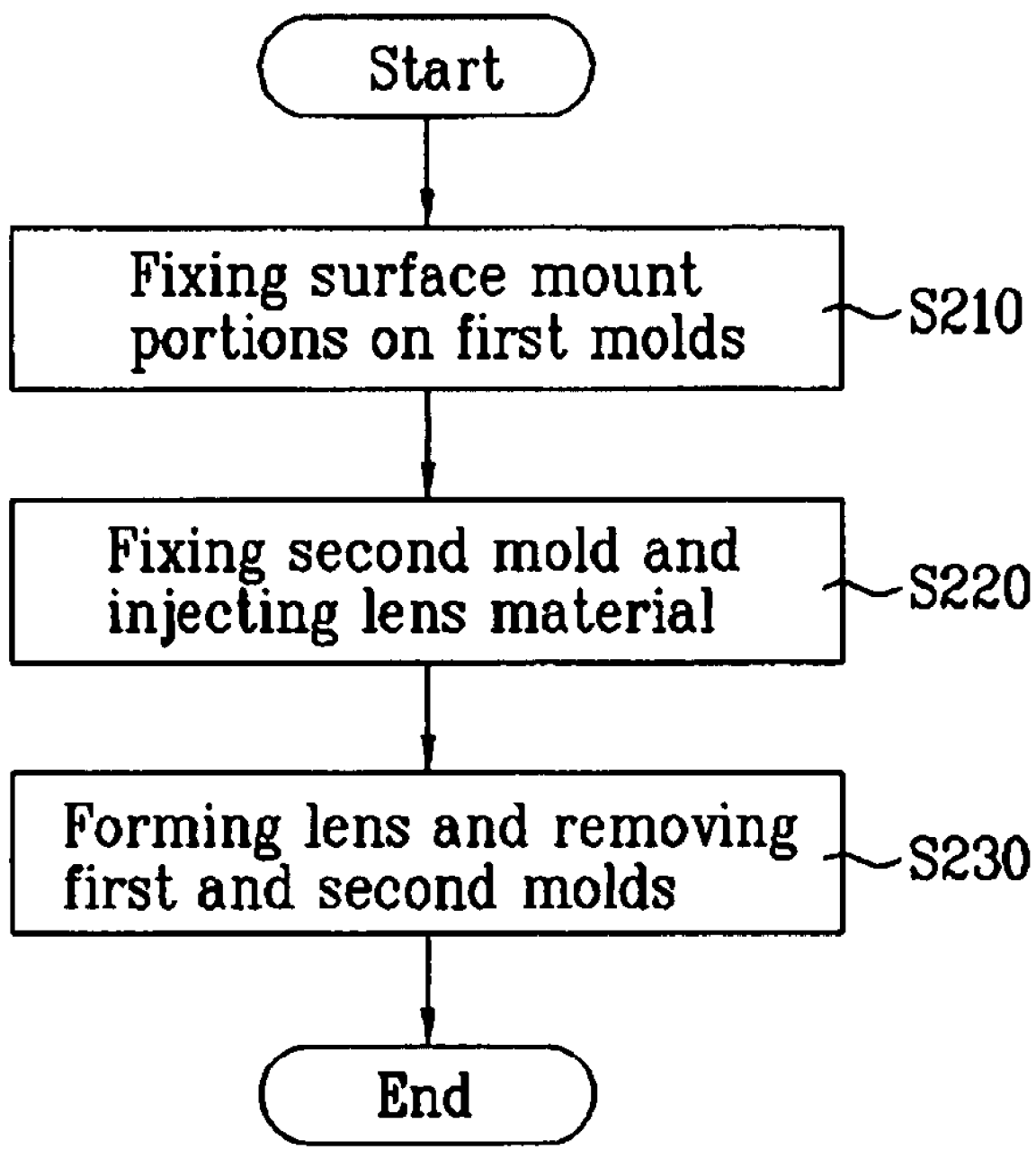
FIG. 2 shows a flowchart of a lens manufacturing method according to another embodiment of the present invention.

FIG. 2 shows a flowchart of a lens manufacturing method according to another embodiment of the present invention. FIGS. 3A to 3F show the lens manufacturing method according to another embodiment of the present invention. The lens manufacturing method according to another embodiment of the present invention will be described with reference to FIGS. 2 to 3F.

The method includes a step of preparing surface mount portions and fixing the surface mount portions to a lens. Specifically, as shown in FIG. 2, the method includes a step S210 of fixing surface mount portions on first molds, a step S220 of fixing a second mold on the first molds with the surface mount portions and injecting a lens material into the second mold, and a step S230 of processing the lens material to form a lens and removing the first and second molds.

First, surface mount portions 310 and first molds 300a and 300b are prepared. Although the surface mount portions 310 are provided as a pair of surface mount portions in a shape similar to 'ㄴ' in FIG. 3A, at least one surface mount portion may be disposed. As the number of the surface mount portions increases, there is an advantage in fixing the lens, but there is a problem such as an increase in the cost. The surface mount portions 310 are formed of metal such as Au, Ag, Cu and Al. The surface mount portions 310 may be formed of any material capable of fixing the lens to the substrate. The surface mount portions 310 are bent in a 'ㄴ' shape such that they can be easily fixed on the first molds 300a and 300b, the lens, and substrate as will be described below. In this case, as described above, the surface mount portions 310 may have another shape such as 'ㄱ', 'ㄴ', 'ㄹ' and '↓' as well as the 'ㄴ' shape.

Figure 3A:
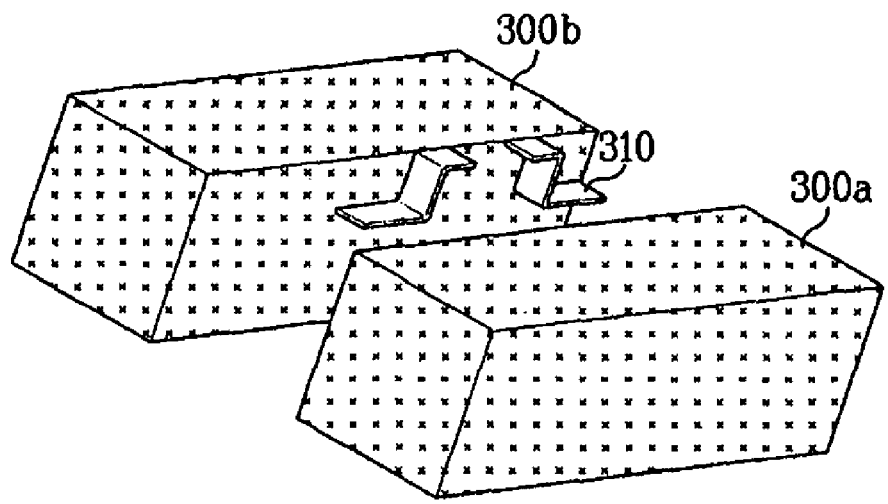
FIGS. 3A to 3F show the lens manufacturing method according to another embodiment of the present invention.

Each of the surface mount portions 310 includes a second part to be fixed on the lens and a first part to be fixed on the substrate. Further, the first molds 300a and 300b are provided as a pair of first molds in a hexahedral shape as shown in FIG. 3A. In this embodiment, the first molds 300a and 300b are not necessarily formed in a hexahedral shape and it is sufficient if the process of fixing the surface mount portions can be performed with two first molds. Further, the first molds 300a and 300b may be formed of any material capable of fixing the surface mount portions 310.

Figure 3B:
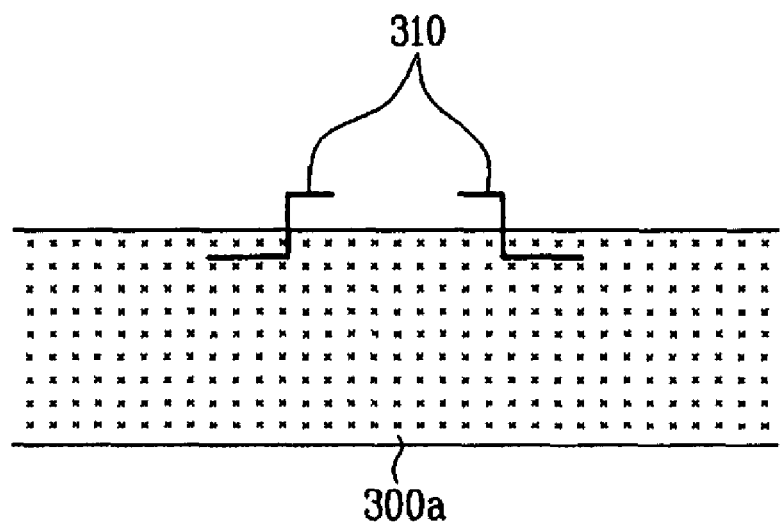

Then, as shown in FIG. 3B, the surface mount portions 310 are fixed on the first molds 300a and 300b. In this case, preferably, the surface mount portions 310 are firmly fixed in a space formed in the first molds 300a and 300b. When a portion of the first molds 300a and 300b is melted to fix the surface mount portions 310, there is a problem in the following separation process. Accordingly, it is not allowed that the first molds 300a and 300b are melted to mix with the surface mount portions 310 formed of Au, Ag, Cu, Al, or the like. In FIG. 3B, a left portion 300a and a right portion 300b of the first molds are put together to fix the surface mount portions 310 in an inner space. That is, in FIG. 3B, the surface mount portions 310 are fixed in the first molds, and the surface mount portions 310 are surrounded by the first mold 300a such that they are not shown at the outside.

Figure 3C:
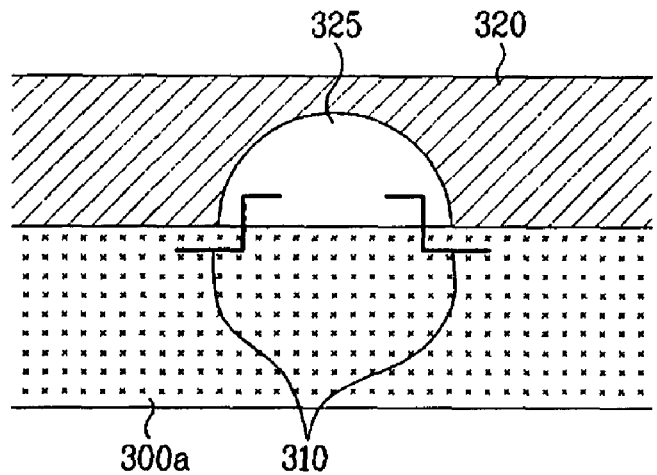
Figure 3D:
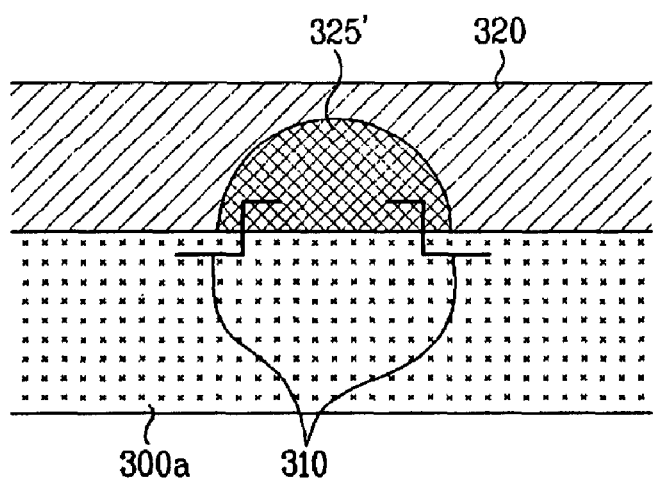

Then, as shown in FIGS. 3C and 3D, a second mold 320 is fixed on the first molds 300a and 300b with the surface mount portions 310 fixed thereon, and a lens material 325' is injected into the second mold 320. The lens material 325' may be formed of thermosetting resin such as silicon, epoxy, PC and PMMA or thermoplastic resin. In this case, the second mold 320 should not be mixed with the lens material 325'.

First, as shown in FIG. 3C, the second mold 320 is formed on the first molds 300a and 300b with the surface mount portions 310 fixed thereon. In FIG. 3C, the second mold 320 is represented as a hexahedron having an empty space 325 of a hemispherical shape. The lens material is injected into the empty space 325 to form a lens. Accordingly, the empty space 325 may be formed differently according to the shape of a lens to be formed. Further, the second mold 320 is fixed on the first molds 300a and 300b such that the lens material is injected into the empty space 325 as will be described below. Further, the surface mount portions 310 should be positioned in the empty space 325 inside the second mold 320.

Then, as shown in FIG. 3D, the lens material 325' is injected into the second mold 320. Since the lens material 325' is injected through the first molds 300a and 300b and the second mold 320, a passage for injecting the lens material is disposed in the first molds or the second mold. The lens material 325' is injected with fluidity and filled in an inner space of the second mold 320. When the process of injecting the lens material 325' is completed, the surface mount portions 310 are positioned in the lens material 325'.

Further, the lens material 325' is processed through a hardening process of cooling the lens material 325' to form a lens. In this case, a portion of the surface mount portions 310 should be firmly fixed into the lens and the first and second molds should be easily separated from the lens.

Figure 3E:
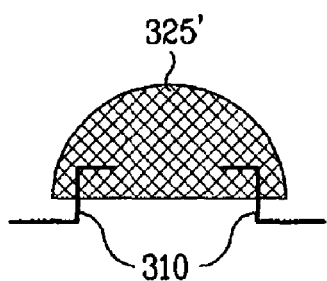

Then, when the first and second molds are removed, as shown in FIG. 3E, the lens is completed. That is, the surface mount portions 310 are formed in the completed lens 325'. Although a pair of 'ㄱ'-shaped surface mount portions 310 is shown in FIG. 3E, the number and shape of the surface mount portions 310 may vary if they can fix the lens to the substrate. In this embodiment, a portion referred to as a "lens" is equal to a portion referred to as a "refractive portion" in the above embodiment of the lens.

Figure 3F:
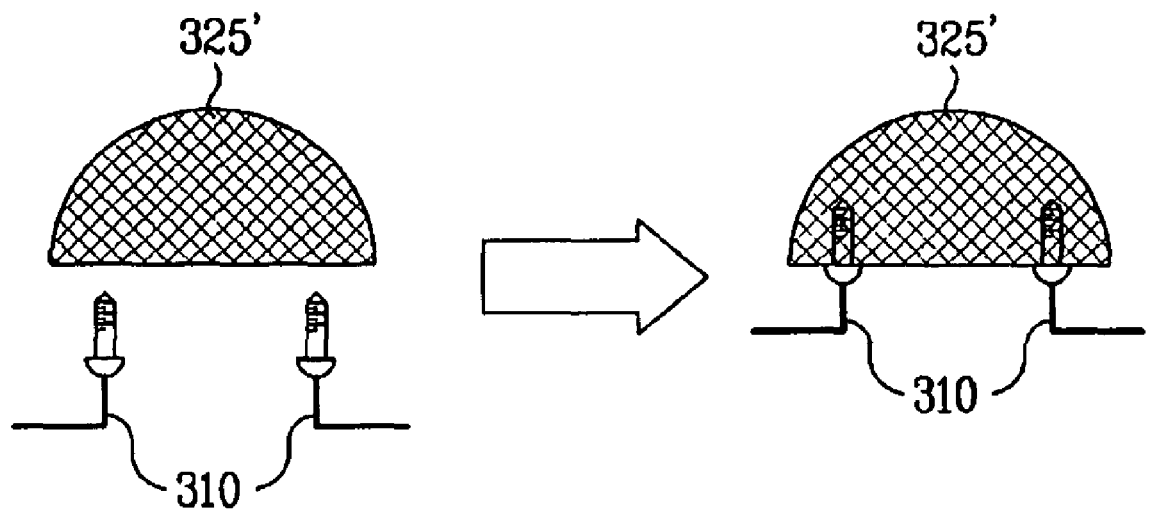

After the surface mount portions 310 are positioned in the lens material 325', the lens material 325' is hardened to fix the surface mount portions 310. However, as shown in FIG. 3F, the surface mount portions 310 may be formed in a screw shape and the screw-shaped surface mount portions 310 may be inserted and fixed into the lens.

The lens manufactured by the lens manufacturing method according to the embodiment of the present invention may be easily and firmly fixed on the substrate or the like through the surface mount portions.

Figure 4:
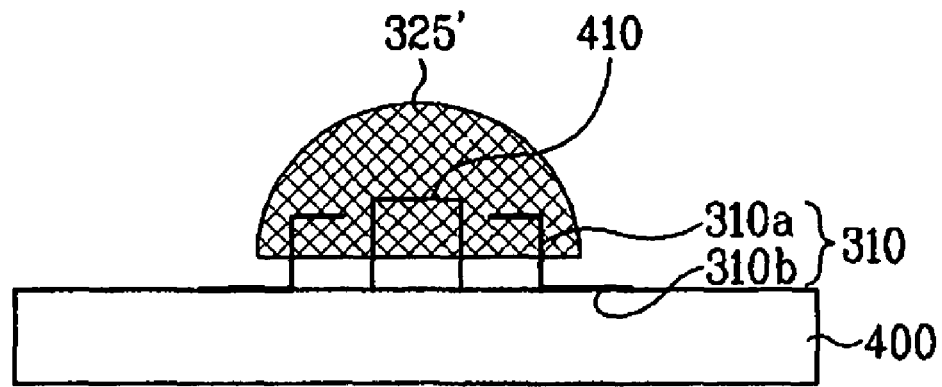
FIG. 4 shows a cross-sectional view of a light emitting device package according to yet another embodiment of the present invention.

FIG. 4 shows a cross-sectional view of a light emitting device package according to yet another embodiment of the present invention. The light emitting device package according to yet another embodiment of the present invention will be described with reference to FIG. 4.

The light emitting device package with the above-described lens includes a light emitting portion 410 formed on a substrate 400 and the lens 325' fixed on the substrate 400 through the surface mount portions 310. The substrate (printed circuit board; PCB) 400 includes a circuit for driving a light emitting device and the like and the surface mount portions 310 are fixed on the substrate 400. Further, if the substrate 400 is formed of silver or white epoxy-based PSR resin or the like, it is possible to increase reflectivity of the light emitting device package. Further, the substrate 400 may be formed of a semiconductor material such as Si, ceramic or a resin material. The substrate 400 may include a single layer made of the above-mentioned material or multiple layers. In this case, the respective layers may be formed of the same material or different materials. When the substrate 400 is formed of the same material, the material of the substrate 400 may be patterned by an etching method or the like. When the substrate 400 is formed of different materials, the respective layers that have been patterned may be stacked.

Although the first parts 310b of the surface mount portions 310 are fixed on the surface of the substrate 400 in FIG. 4, the first parts 310b may be inserted and fixed into the substrate 400. Further, the second parts 310a of the surface mount portions 310 are fixed on the lens 325'. Further, since the light emitting portion 410 is surrounded by the lens 325', light emitted from the light emitting portion 410 is refracted through the lens 325' and then emitted to the outside while a light path is changed. Although the light emitting portion 410 is surrounded by the lens 325', it is represented in a different way in FIG. 4.

The surface mount portions 310 are formed of Au, Ag, Cu, Al or the like. The lens 325' may be formed of thermosetting resin such as silicon, epoxy, PC and PMMA or thermoplastic resin. Further, as described above, the surface mount portions 310 are formed in a shape of 'ㄱ', 'ㄴ', 'ㅂ', 'ㅗ', 'ㄹ' or the like.

Further, although the light emitting portion 410 is formed on the substrate 400 while being in contact with the substrate 400 in FIG. 4, the light emitting portion 410 may be formed while be spaced from the substrate 400. Further, in order to position the light emitting portion 410 in the lens 325' as shown in FIG. 4, a space for the light emitting portion 410 should be formed in the lens 325'. Thus, for the manufacture of the lens, in the lens manufacturing method of the above-described embodiment, a protruded portion may be formed at a central portion of the first mold to form an empty space at the center of the lens. Further, although the lens 325' is represented in a hemispherical shape, the lens 325' may be formed in a spherical or non-spherical shape, or in a shape having sectional curvature or bisectional curvature, preferably, having at least one curvature. The lens 325' should be fixed on the substrate 400 through the surface mount portions 310. Further, although two surface mount portions 310 are shown in FIG. 4, at least one surface mount portions may be disposed as described above. Further, the light emitting portion 410 should be a device capable of emitting light, for example, a light emitting diode (LED).

The light emitting device package according to the embodiment of the present invention has the following effects.

Since the lens is fixed on the substrate through the surface mount portions in the above embodiments, the lens can be fixed without using an adhesive differently from a conventional case. Thus, the lens is accurately and firmly fixed at a specified position on the substrate to refract light emitted from the light emitting portion, thereby emitting light at a designed angle.

According to the lens, the manufacturing method thereof and the light emitting device package of the present invention, the light emitting device and lens can be arranged accurately on the substrate. Also, the light emitting device and lens can be easily and inexpensively arranged on the substrate.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing a lens comprising:
   preparing at least one surface mount portion having a first part and a second part to be fixed on the lens,
   fixing a first part of the surface mount portion on a first mold, wherein the first mold is divided into at least two portions, by coupling the at least two portions while the surface mount portion is disposed at an inside of the first mold,
   fixing a second mold on the first mold and injecting a lens material into the second mold; and
   processing the lens material to form the lens and removing the first mold and the second mold.

2. The method according to claim 1, wherein the lens material is formed of thermosetting resin such as silicone, epoxy, PC, and PMMA or thermoplastic resin, and
   the lens material is processed by cooling the lens material.

3. The method according to claim 1, wherein the first mold is formed of metal which is not mixed with Au, Ag, Cu, and Al.

4. The method according to claim 1, wherein the second mold is formed of metal which is not mixed with thermosetting resin such as silicone, epoxy, PC, and PMMA or thermoplastic resin.

* * * * *

UNITED STATES PATENT AND TRADEMARK OFFICE
CERTIFICATE OF CORRECTION

| | | |
|---|---|---|
| PATENT NO. | : 7,733,573 B2 | Page 1 of 1 |
| APPLICATION NO. | : 11/902779 | |
| DATED | : June 8, 2010 | |
| INVENTOR(S) | : Yong Suk Kim et al. | |

It is certified that error appears in the above-identified patent and that said Letters Patent is hereby corrected as shown below:

Title Page
Item (73) should read:

(73) Assignee: LG Electronics Inc., Seoul (KR) and LG Innotek Co., Ltd., Seoul (KR)

Signed and Sealed this
Thirteenth Day of September, 2011

David J. Kappos
*Director of the United States Patent and Trademark Office*